(12) United States Patent
Ke

(10) Patent No.: US 11,631,701 B2
(45) Date of Patent: Apr. 18, 2023

(54) DISPLAY DEVICE

(71) Applicant: AU OPTRONICS CORPORATION, Hsin-Chu (TW)

(72) Inventor: Tsung-Ying Ke, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 17/401,373

(22) Filed: Aug. 13, 2021

(65) Prior Publication Data
US 2022/0102387 A1    Mar. 31, 2022

(30) Foreign Application Priority Data

Sep. 28, 2020 (TW) .................................. 109133653

(51) Int. Cl.
*H01L 27/12* (2006.01)
*G02F 1/1333* (2006.01)
*G02F 1/1368* (2006.01)

(52) U.S. Cl.
CPC ........ *H01L 27/1218* (2013.01); *G02F 1/1368* (2013.01); *G02F 1/133305* (2013.01); *G02F 2202/28* (2013.01); *H10K 59/12* (2023.02); *H10K 77/111* (2023.02); *H10K 2102/311* (2023.02)

(58) Field of Classification Search
CPC ............. H01L 27/1218; H01L 27/3244; H01L 51/0097; H01L 2251/5338; H01L 27/1214; G02F 1/133305; G02F 1/1368; G02F 2202/28; G02F 1/1362
See application file for complete search history.

(56) References Cited

U.S. PATENT DOCUMENTS

| | | | |
|---|---|---|---|
| 10,367,173 B1 * | 7/2019 | Wu .......................... | G02B 1/14 |
| 10,734,612 B2 | 8/2020 | Wu et al. | |
| 11,016,537 B2 | 5/2021 | Lee et al. | |
| 11,024,828 B2 | 6/2021 | Kim et al. | |

(Continued)

FOREIGN PATENT DOCUMENTS

| CN | 106502319 A | 3/2017 |
|---|---|---|
| CN | 109377887 A | 2/2019 |

(Continued)

OTHER PUBLICATIONS

TIPO has issued the Office Action for the corresponding Taiwan application dated Mar. 16, 2021.

(Continued)

*Primary Examiner* — Mariam Qureshi
(74) *Attorney, Agent, or Firm* — WPAT, PC

(57) ABSTRACT

A display device includes a display medium layer, an active component array layer, a support layer, and a first adhesive layer. The display medium layer has a light-emitting surface. The active component array layer is disposed on a side of the display medium layer away from the light-emitting surface. The support layer is disposed on a side of the active component array layer away from the display medium layer. The first adhesive layer is connected between the active component array layer and the support layer, in which the active component array layer is directly connected to the first adhesive layer. The first adhesive layer has a Young's modulus greater than 10 GPa.

10 Claims, 5 Drawing Sheets

(56) References Cited

U.S. PATENT DOCUMENTS

| | | | |
|---|---|---|---|
| 2011/0182046 A1* | 7/2011 | Shiota | H05K 3/361 |
| | | | 361/783 |
| 2019/0373719 A1* | 12/2019 | Lee | H05K 1/111 |
| 2019/0391614 A1* | 12/2019 | Mathew | H01L 51/5281 |
| 2021/0200381 A1* | 7/2021 | Kang | B32B 17/10 |
| 2021/0217975 A1* | 7/2021 | Gu | G09F 9/30 |
| 2022/0262282 A1* | 8/2022 | Lee | G09F 9/301 |

FOREIGN PATENT DOCUMENTS

| | | | |
|---|---|---|---|
| CN | 110277020 A | 9/2019 |
| CN | 106652802 B | 3/2020 |
| TW | 201743304 A | 12/2017 |
| TW | 202031857 A | 9/2020 |

OTHER PUBLICATIONS

China National Intellectual Property Administration has issued the Office Action for the corresponding CN application dated Oct. 19, 2022.

* cited by examiner

DISPLAY DEVICE

FIELD OF THE INVENTION

The present invention relates to a display device, particularly to a display device with enhanced impact endurability.

BACKGROUND OF THE INVENTION

In the existing flat-panel display technology, active matrix displays take on the mainstream role. Active matrix displays mainly include a matrix substrate composed of active components and display medium (active or passive). The display medium in each light-emitting unit is driven by an active component (e.g., a transistor) independently.

Compared to passive matrix displays, active matrix displays boast the advantage of lower power consumption and higher resolution due to each light-emitting unit being independently driven. By now, some flat panel display products have developed flexible display panel technology, wherein Polyimide (PI) film is used to replace the glass substrate of conventional active matrix displays as the flexible substrate for active matrix to meet the requirement for flexibility. However, the flexible property of the PI substrates also lowers the impact endurability of active matrix. Moreover, flexible active matrix substrates may also lead to bonding failure between wirings of the driver circuit board and the flexible circuit board on the substrate.

SUMMARY OF THE INVENTION

One object of the present invention is to provide a display panel having an adhesive layer which has a high Young's modulus to enhance impact endurability of the active matrix.

An aspect of the present invention is to provide a display device. The display device includes a display medium layer, an active component array layer, a support layer, and a first adhesive layer. The display medium layer having a light-emitting surface. The active component array layer is disposed on a side of the display medium layer away from the light-emitting surface. The support layer is disposed on a side of the active component array layer away from the display medium layer. The first adhesive layer is disposed between the active component array layer and the support layer. The active component array layer is directly connected to the first adhesive layer. The first adhesive layer has a Young's modulus greater than 10 GPa.

Please refer to the following detailed description and figures to better understand the features and contents of the present invention. Figures are provided for the purposes of illustration and description, and not as definitions of the limits of the claims.

DETAILED DESCRIPTION OF THE PREFERRED EMBODIMENTS

The display device according to the present invention will be described in detail below through embodiments and with reference to the FIGS. 1A to 7B, a person having ordinary skill in the art may understand the advantages and effects of the present disclosure through the contents disclosed in the present specification. However, the contents shown in the following sentences never limit the scope of the present disclosure. Without departing from the conception principles of the present invention, a person having ordinary skill in the present art may realize the present disclosure through other embodiments based on different views and applications.

In the accompanying drawings, for the purpose of clarification, the thicknesses of layers, films, panels, regions and the like are amplified. In the whole specification, the same marks represent the same element. It should be understood that, when an element such as a layer, a film, a panel, a region or a substrate are described as "being on" or "being connected to" another element, they may be directly on or connected to another element, or there may be other elements therebetween. On other hands, when an element is described as "directly exists on another element" or "directly connects to" another element, there is no element therebetween. As used in the present specification, a "connection" may be a physical and/or electrical connection. In addition, an "electrical connection" or "coupling" means that other elements may exist therebetween.

Moreover, it should be understood that, even though the terms such as "First", "Second", "Third" may be used to describe an element, a part, a region, a layer and/or a portion in the present specification, but these elements, parts, regions, layers and/or portions are not limited by such terms. Such terms are merely used to differentiate an element, a part, a region, a layer and/or a portion from another element, part, region, layer and/or portion. Therefore, in the following discussions, a first element, portion, region, layer or portion may be called a second element, portion, region, layer or portion, and do not depart from the teaching of the present disclosure.

First Embodiment

Figure 1A:
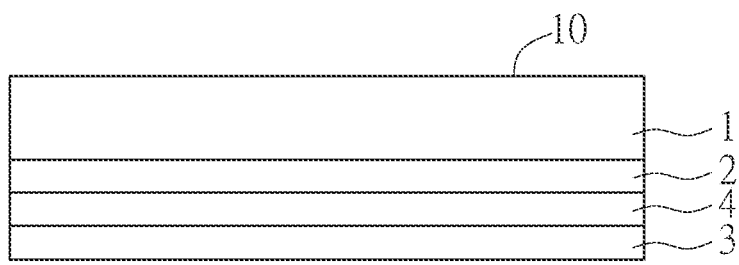
FIG. 1A illustrates a schematic view of a display device of the first embodiment of the present invention.

Please refer to FIG. 1A; the first embodiment of the present invention provides a display device 1000A as shown in FIG. 1A. The display device 1000A includes a display medium layer 1, an active component array layer 2, a support layer 3, and a first adhesive layer 4. The display medium layer 1 may be a self-luminous medium or a non-self-luminous medium. The display medium is arranged in an array (in terms of pixels). Self-luminous medium may be organic light-emitting diodes (OLED); non-self-luminous medium may be liquid crystals. The foregoing are just exemplary, and the present invention is not limited thereto. In this embodiment, the active component array layer 2 is a thin film transistor (TFT) array. The display medium layer 1 has a light-emitting surface 10, and the active component array layer 2 is disposed on a side of the display medium layer 1 away from the light-emitting surface 10, so as to control light emission of the display medium layer 1 to the light-emitting surface 10. The support layer 3 is disposed on a side of the active component array layer 2 away from the display medium layer 1. In this embodiment, the support layer 3 may be a flexible steel use stainless (SUS) board or a transparent plastic board (e.g., polyethylene terephthalate (PET) board), and the present invention is not limited thereto. The first adhesive layer 4 is connected between the active component array layer 2 and the support layer 3.

Specifically, in the display device 1000A of this embodiment, the active component array layer 2 is directly connected to the first adhesive layer 4, and the first adhesive layer 4 is an adhesive material with high Young's modulus. In this embodiment, the first adhesive layer 4 has a Young's modulus greater than 10 GPa. With the aforementioned features, the impact endurability of the active component array layer 2 of the display device 1000A can be increased. Accordingly, when the display device 1000A is impacted on the display surface 10, for example, when using a stylus on the display surface 10, and therefore causing impact on the display surface 10, the active component array layer 2 (with the support of the first adhesive layer 4 of this embodiment) will not easily get damaged.

Figure 1B:
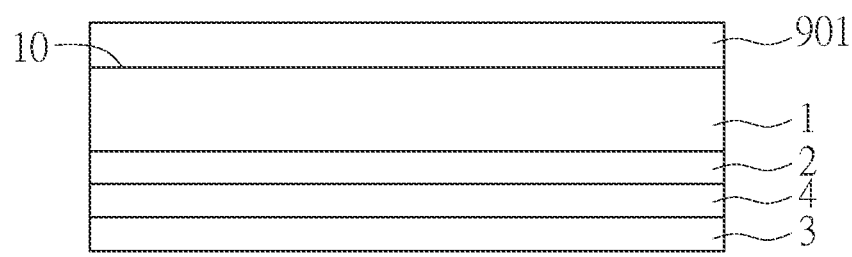
FIG. 1B illustrates a schematic view of a display device, of the first the embodiment of the present invention, having a protection layer.
Figure 1C:
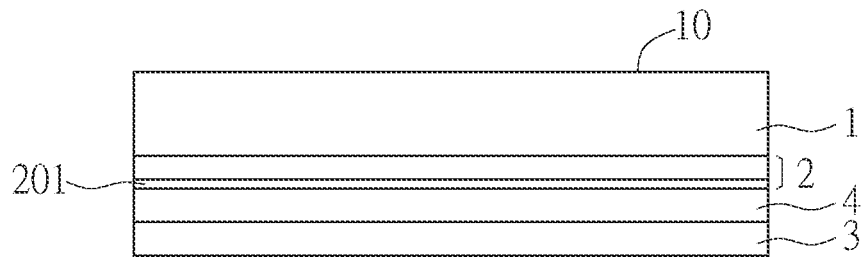
FIG. 1C illustrates a schematic view of an active component array, of a display device of the first the embodiment of the present invention, having a buffer layer.
Figure 1D:
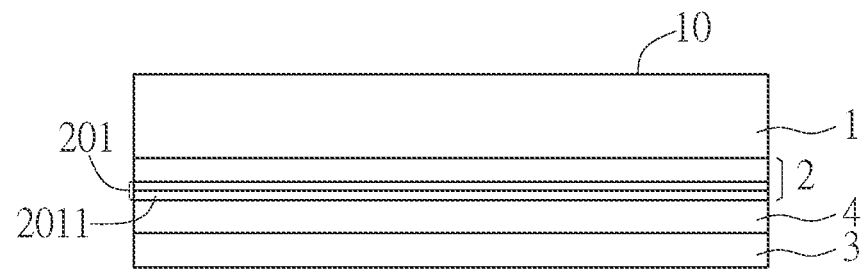
FIG. 1D illustrates a schematic view of a buffer layer, of a display device of the first the embodiment of the present invention, having a metal layer.

As shown in FIG. 1B, in a display device 1000B of a variant embodiment, a protection layer 901 may be disposed on a side of the display medium layer 1 adjacent to the display surface 10. Depending on the needs of practical application, in other embodiments, the protection layer 901 may include, for example, functional layers such as color filter layer. Please refer to FIG. 1C; in a display device 1000C of another variant embodiment, a buffer layer 201 can be disposed on a side of the active component array layer 2 adjacent to the first adhesive layer 4. The thickness of the buffer layer 201 may be in the range of 10 nm to 10 □m. The buffer layer 201 is a non-organic oxide layer formed between the TFTs and the glass substrate in the TFT array manufacturing process, for preventing leakage current between the electron channel layer and the glass substrate, and restraining impurities of the glass substrate from diffusing into the electron channel layer. Generally speaking, after the lift-off process in which the TFT array is separated from the glass substrate, the buffer layer is attached to the TFT array. Please refer to the variant embodiment as shown in FIG. 1D; the display device 1000D may further include a metal layer 2011 at the side of the buffer layer 201 away from the display surface 10. The metal layer 2011 is formed during the active component array manufacturing process, so as to facilitate the separation of the active component array layer 2 from the substrate after the formation of the active component array layer 2.

In the first embodiment, through the direct connection of active component array layer 2 and the first adhesive layer 4, impact endurability of the display devices 1000A, 1000B, 1000C, and 1000D are enhanced.

Second Embodiment

Figure 2A:
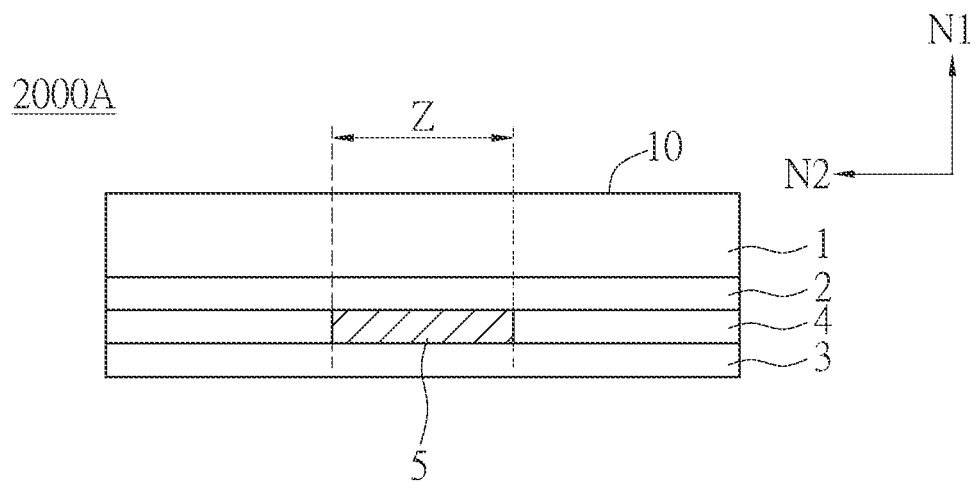
FIG. 2A illustrates a schematic view of a display device of the second embodiment of the present invention.
Figure 2B:
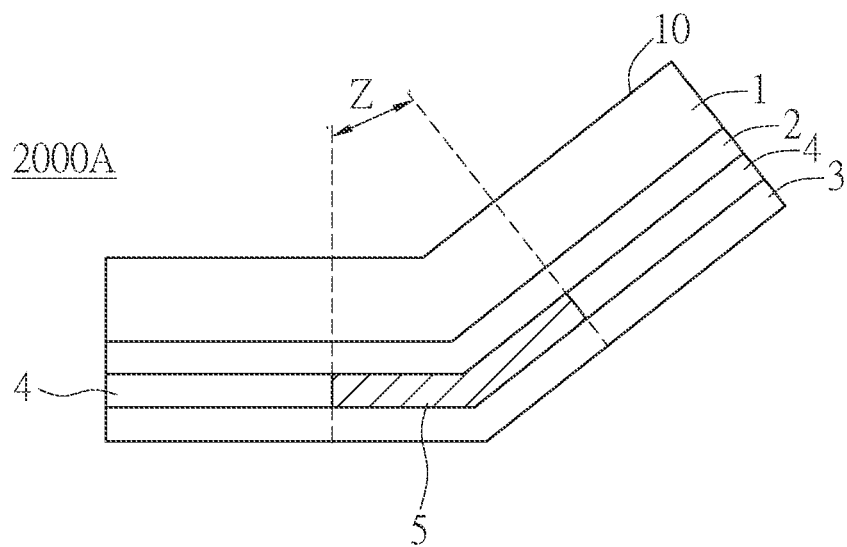
FIG. 2B illustrates a schematic implementation view of a display device of the second the embodiment of the present invention.

The second embodiment of the present invention will be described with reference to FIG. 2A through FIG. 4. In the second embodiment, the same elements as those in the first embodiment have the same reference numerals and similar functionality, and will not be elaborated again. The difference between the second embodiment and the first embodiment is that the display device 2000A of the second embodiment has a flexible area Z. In other words, as shown in FIG. 2B, the display device 2000A is more flexible at the flexible area Z. In the embodiment shown in FIG. 2A, the display device 2000A includes a second adhesive layer 5, which has a Young's modulus lower than 10 GPa. The second adhesive layer 5 is at least partly located at the flexible area Z. The second adhesive layer 5 is connected between the active component array layer 2 and the support layer 3. The second adhesive layer 5 is directly connected to the active component array layer 2. With the second adhesive layer 5, the display device 2000A of this embodiment attains the effect to be bendable at flexible area Z. Furthermore, in this embodiment, the active component array layer 2 is connected to the first adhesive layer 4 (which has a high Young's modulus) at location outside of the flexible area Z. In other words, the first adhesive layer 4 and the second adhesive layer 5 are in the same layer in the second direction N2, and correspond to non-flexible area and the flexible area Z in the first direction N1, respectively. Accordingly, at locations outside of the flexible area Z, the display device 2000A still attains the effect of enhancing the impact durability of the active component array layer 2.

Figure 3:
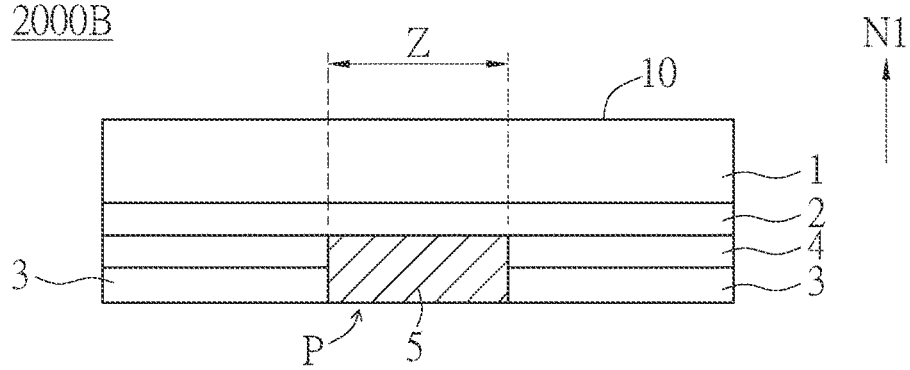
FIG. 3 illustrates a variant embodiment of a display device of the second embodiment of the present invention.

Please refer to FIG. 3; in a variant embodiment, a display device 2000B is provided. A support layer 3 of the display device 2000B has an opening P. The opening P corresponds to the second adhesive layer 5 in the first direction N1 which is perpendicular to the light-emitting surface 10. The second adhesive layer 5 extends from a side of the active component layer 2 away from the display medium layer 1 to the opening P, and fills up the opening P. Through the foregoing configuration, the thickness of the second adhesive layer 5 of this embodiment is not limited by the support layer 3. Therefore, through selection of the material for the second adhesive layer 5, flexibility of the display device 2000B at the flexible area Z could be better controlled.

Figure 4:
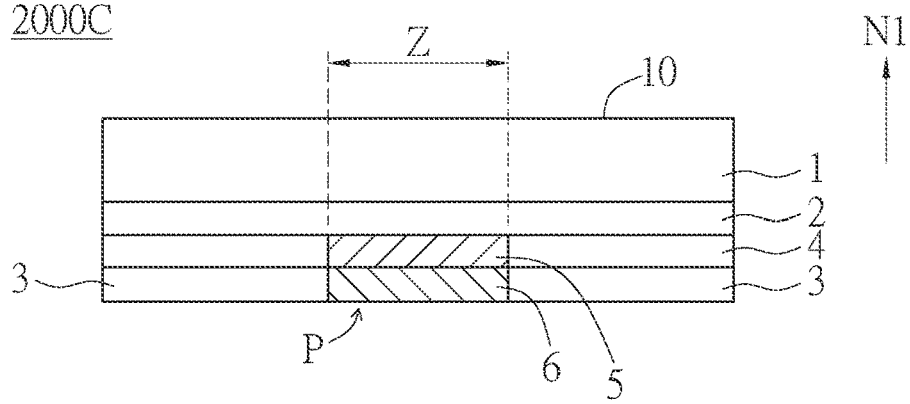
FIG. 4 illustrates another variant embodiment of a display device of the second embodiment of the present invention.

FIG. 4 illustrates another variant embodiment of the present invention, in which a display device 2000C is provided. The opening P of the support layer 3 may be filled up with a third adhesive layer 6 having a Young's modulus different from that of the second adhesive layer 5. In addition, Young's modulus of the third adhesive layer 6 is less than that of the first adhesive layer 4. In one embodiment, Young's modulus of the third adhesive layer 6 is less than 10 GPa, so as to provide better flexibility with the width of the third adhesive layer 6 less than that of the first adhesive layer 4. The present invention does not limit the relation between Young's modulus of the second adhesive layer 5 and the third adhesive layer 6. In one embodiment, the second adhesive layer 5 may have a Young's modulus less than that of the third adhesive layer 6, so as to facilitate bending operation of the display device 2000C with the flexible area Z as the center and the first direction N1 as the bending axis. However, the present invention is not limited thereto. Through the foregoing configuration, the display device 2000C may also attain the effects of flexibility at the flexible area Z and enhanced impact endurability at locations other than the flexible area Z.

In this embodiment, through the first adhesive layer 4 and the second adhesive layer 5 between the active component array layer 2 and the support layer 3, the active component array layer 2 of the display devices 2000A, 2000B, and 2000C may be supported at the flexible area Z by the second adhesive layer 5 which has a relatively lower Young's modulus, and may be supported at locations other than the flexible area Z by the first adhesive layer 4 which has a relatively higher Young's modulus. Accordingly, the display devices 2000A, 2000B, and 2000C of this embodiment may attain the effect of flexibility at the flexible area Z while enhancing impact endurability.

Third Embodiment

Figure 5:
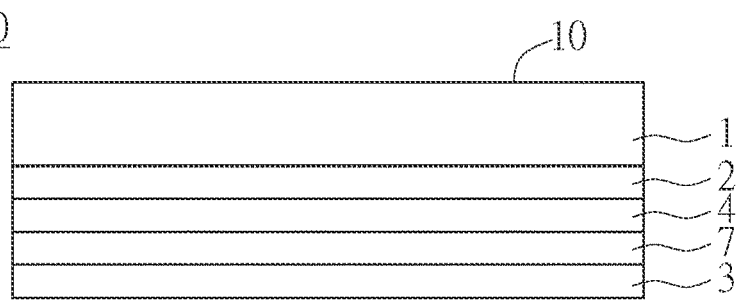
FIG. 5 illustrates a schematic view of a display device of the third embodiment of the present invention.

Please refer to FIG. 5; in the third embodiment, a display device 3000 is provided. In the third embodiment, the same elements as those in the first embodiment have the same reference numerals and similar functionality, and will not be elaborated again. The difference between the display device 3000 of this embodiment and the display device 1000A of the first embodiment is that the display device 3000 further include an auxiliary adhesive layer 7. In this embodiment, the auxiliary adhesive layer 7 connects the first adhesive layer 4 and the support layer 3. The auxiliary adhesive layer 7 has a Young's modulus less than 10 MPa. Specifically, in the first embodiment and the second embodiment, the first adhesive layer 4 is connected between the active component array layer 2 and the support layer 3 by the adhesion of the first adhesive layer 4 itself. For example, the first adhesive layer 4 may be disposed in the stack-up structure of the display medium layer 1 and the active component array layer 2 and the support layer 3 before curing of the first adhesive layer 4, so the first adhesive layer 4 is adhered between the active component array layer 2 and the support layer 3 after curing. While in this embodiment, the first adhesive layer 4 is connected between the active component array layer 2 and the support layer 3 by the adhesion of the auxiliary adhesive layer 7. For example, after the first adhesive layer 4 be disposed on a side of the active component array layer 2 away from the display medium layer 1 and finish curing, the auxiliary adhesive layer 7 (which hasn't cured) may be disposed between the first adhesive layer 4 and the support layer 3, and the auxiliary adhesive layer 7 may be cured thereafter.

In this embodiment, because the auxiliary adhesive layer 7 is not directly connected to the active component array layer 2, contribution to the enhancement of impact endurability is slighter. As a result, adhesive material having lower Young's modulus may be used. For example, in this embodiment, the support adhesive layer 7 is an adhesive material having a Young's modulus less than 1 MPa. However, the present invention is not limited thereto. For example, in one variant embodiment, in order to further improve impact endurability of the active component array layer 2, an auxiliary adhesive layer 7 having a high Young's modulus like the first adhesive layer 4 may be selected.

Fourth Embodiment

The display devices 4000A and 4000B of the fourth embodiment of the present invention will be described with reference to FIGS. 6A, 6B, 7A, and 7B. Please refer to FIG. 6A; in the fourth embodiment, the same elements as those in the first embodiment have the same reference numerals and similar functionality, and will not be elaborated again. The differences between this embodiment and the first embodiment are that the active component array layer 2 in this embodiment has an external circuit bonding area A1 and a display area A2, and that the first adhesive layer 4 corresponds to the external circuit bonding area A1 in the first direction N1. The term "correspond" preferably means that projections (parallel to the first direction N1) of the first adhesive layer 4 and the external circuit bonding area A1 on the support layer 3 are at least partly overlapped with each other.

Figure 6A:
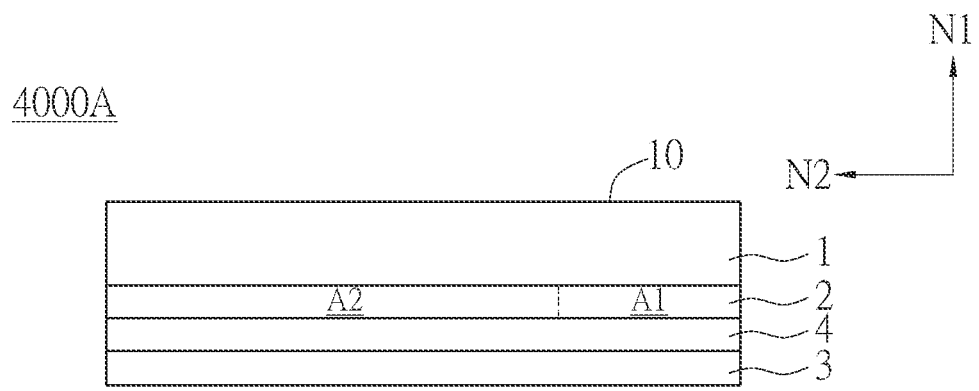
FIG. 6A illustrates a schematic view of a display device of the fourth embodiment of the present invention.
Figure 6B:
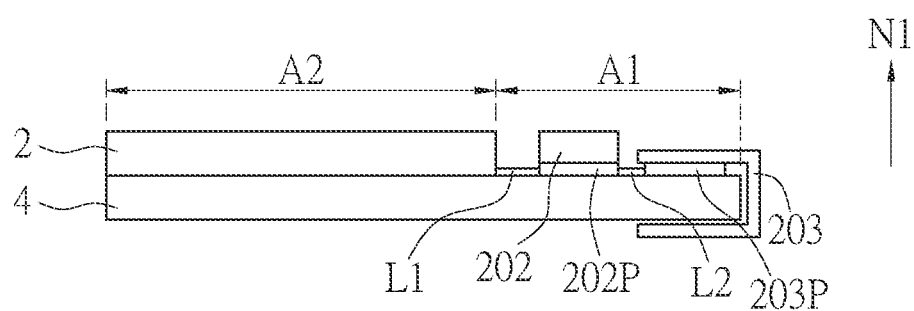
FIG. 6B illustrates a schematic view of an active component array of a display device of the fourth the embodiment of the present invention.

In practical applications, the external circuit bonding area A1 shown in FIG. 6A may include, for example, a disposition area for at least one of a driver chip and a flexible printed circuit board. Specifically, please refer to FIGS. 6A and 6B; FIG. 6B illustrates a driver chip package configuration of TFT display. For the purposes of convenience, FIG. 6B illustrates only the active component array layer 2 and the first adhesive layer 4 of the display device 4000A, and the other elements are omitted. In the embodiment of FIG. 6B, a conventional chip on glass (COG) packaging technology can be implemented. Driver chip 202 of the active component array layer 2 is electrically connected to the active component array layer 2 through the wiring L1 of the active component array layer 2 and the bonding pad 202P, and the flexible circuit board 203 transmits external control signal to the driver chip 202 through another wiring L2 and the bonding pad 203P.

It should be noted that FIG. 6B is merely exemplary, the embodiment is not limited to the display packaging technology applied thereto. For example, in other embodiments, a chip on film (COF) packaging or a chip on plastic (COP) packaging can be implemented. In these embodiments, the external circuit bonding area A1 includes the disposition area for flexible circuit board only.

In the embodiments of FIGS. 6A and 6B, because the active component array layer 2 is directly connected to the first adhesive layer 4 having a high Young's modulus, the driver chip 202 and flexible circuit board 203 at the external circuit bonding area A1 are supported by the first adhesive layer 4 on the side bonded to the bonding pads 202P and 203P. Therefore, during the bonding operation of the driver chip 202 and the flexible circuit board 203, collapse of the driver chip 202 and the flexible circuit board 203 in the opposite direction of the first direction N1 can be avoided to prevent bonding failure. Through the foregoing configuration, the bonding success rate of the driver chip 202 and the flexible circuit board 203 with the active component array layer 2 can be increased, and the stability of the electrical connection at the bonding location is also increased.

In the embodiment of FIG. 6A, the first adhesive layer 4 extends in the second direction N2, and the second direction N2 is perpendicular to the first direction N1, so the first adhesive layer 4 corresponds to both of the external circuit bonding area A1 and the display area A2. Accordingly, this embodiment may attain the effects of improving the bonding success rate of external circuit and enhancing impact endurability of the display area A2 of the active component array layer 2.

Figure 7A:
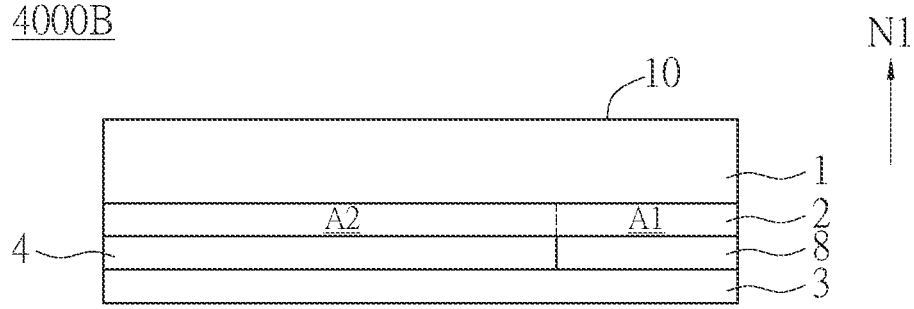
FIG. 7A illustrates a schematic view of a variant embodiment of a display device of the fourth embodiment of the present invention.

FIG. 7A illustrates a display device 4000B provided by a variant embodiment of the fourth embodiment. In comparison to the embodiment of FIG. 6A, the display device 4000B further includes a fourth adhesive layer 8. The fourth adhesive layer 8 is disposed between the active component array layer 2 and the support layer 3, and corresponds to the external circuit bonding area A1 in the first direction N1. In this variant embodiment, the fourth adhesive layer 8 has a Young's modulus greater than that of the first adhesive layer 4.

Figure 7B:
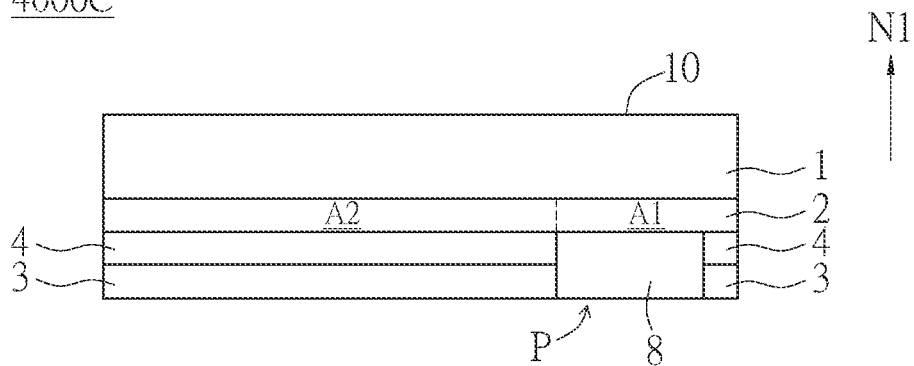
FIG. 7B illustrates a variant embodiment of a display device of the fourth embodiment of the present invention.

Please refer to FIG. 7B, in one variant embodiment, the support layer 3 may further include the opening P. The opening P corresponds to the external circuit bonding area A1 in the first direction N1, and the fourth adhesive layer 8 fills up the opening P. Accordingly, the impact endurability of the active component array layer 2 at the external circuit bonding area A1 can be further improved.

In the fourth embodiment, through the correspondence of the fourth adhesive layer 8 to the external circuit bonding area A1 of the active component array layer 2 in the first direction N1, the bonding success rate of the bonding of external circuit and the active component array layer 2 as well as the electrical stability after the bonding may be improved.

The foregoing disclosure is merely preferred embodiments of the present invention and is not intended to limit the claims of the present invention. Any equivalent technical variation of the description and drawings of the present invention of the present shall be within the scope of the claims of the present invention.

What is claimed is:

1. A display device, comprising:
    a display medium layer comprising a light-emitting surface;
    an active component array layer disposed on a side of the display medium layer away from the light-emitting surface;
    a support layer disposed on a side of the active component array layer away from the display medium layer;
    a first adhesive layer connected between the active component array layer and the support layer, wherein the active component array layer is directly connected to the first adhesive layer, and the first adhesive layer has a first Young's modulus greater than 10 GPa; and
    a fourth adhesive layer connected to the first adhesive layer and connected between the active component array layer and the support layer, wherein the active component array layer is directly connected to the fourth adhesive layer, and the fourth adhesive layer has a second Young's modulus greater than 10 GPa,
    wherein the active component array layer has an external circuit bonding area and a display area, and the first adhesive layer corresponds to the display area in a first direction perpendicular to the light-emitting surface, wherein the fourth adhesive layer corresponds to the external circuit bonding area in the first direction, a bonding pad disposed on a side of the active component array layer away from the fourth adhesive layer, a flexible circuit board at the external circuit bonding area bonded to the bonding pad on the active component array layer.

2. The display device of claim 1, wherein the display device has a flexible area, the display device further comprises a second adhesive layer disposed between the active component array layer and the support layer, the second adhesive layer is at least partly located at the flexible area, and the second adhesive layer has a Young's modulus less than 10 GPa.

3. The display device of claim 2, wherein the support layer has an opening, the opening corresponds to the second adhesive layer in the first direction perpendicular to the light-emitting surface, and the second adhesive layer extends to fill up the opening.

4. The display device of claim 2, wherein the support layer has an opening, the opening corresponds to the second adhesive layer in the first direction perpendicular to the light-emitting surface, the display device further comprises a third adhesive layer, the third adhesive layer is located at the opening and fills up the opening, and the third adhesive layer has a Young's modulus less than the Young's modulus of the first adhesive layer.

5. The display device of claim 1, further comprising an auxiliary adhesive layer, wherein the auxiliary adhesive layer is disposed between the first adhesive layer and the support layer, and the auxiliary adhesive layer has a Young's modulus less than 1 MPa.

6. The display device of claim 1, wherein the first adhesive layer corresponds to the display area in the first direction perpendicular to the light-emitting surface.

7. The display device of claim 6, wherein the support layer has an opening, the opening corresponds to the external circuit bonding area in the first direction, and the fourth adhesive layer extends to fill up the opening.

8. The display device of claim 1, wherein the second Young's modulus is greater than the first Young's modulus.

9. The display device of claim 1, further comprising a buffer layer disposed on a side of the active component array layer connected to the first adhesive layer, and a thickness of the buffer layer is in the range of 10 nm to 10 μm.

10. The display device of claim 9, further comprising a metal layer disposed on a side of the buffer layer away from the light-emitting surface.

* * * * *